(12) United States Patent
Aga et al.

(10) Patent No.: US 7,589,649 B1
(45) Date of Patent: Sep. 15, 2009

(54) APPARATUS, METHOD, AND SYSTEM FOR CORRECTION OF BASELINE WANDER

(75) Inventors: Arshan Aga, Mountain View, CA (US); Chi Fung Cheng, San Jose, CA (US); Hongxin Song, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/800,554

(22) Filed: May 4, 2007

Related U.S. Application Data

(60) Provisional application No. 60/798,630, filed on May 8, 2006.

(51) Int. Cl.
*H03M 1/06* (2006.01)
(52) U.S. Cl. .................. 341/118; 341/119; 341/120; 341/139; 341/143; 341/155
(58) Field of Classification Search .............. 341/118, 341/120, 139, 143, 155
See application file for complete search history.

(56) References Cited

U.S. PATENT DOCUMENTS

| | | | | | |
|---|---|---|---|---|---|
| 5,410,366 | A | * | 4/1995 | Hostetler | 348/695 |
| 5,798,802 | A | * | 8/1998 | Elmis et al. | 348/689 |
| 5,990,707 | A | * | 11/1999 | Goldenberg et al. | 327/64 |
| 6,052,245 | A | * | 4/2000 | Sugawara et al. | 360/46 |
| 6,084,538 | A | * | 7/2000 | Kostelnik et al. | 341/120 |
| 6,417,723 | B1 | * | 7/2002 | Srodzinski | 327/538 |
| 6,476,593 | B1 | * | 11/2002 | Schmal et al. | 324/76.24 |
| 6,515,602 | B2 | * | 2/2003 | Ahn et al. | 341/139 |
| 6,597,650 | B2 | * | 7/2003 | Katakura et al. | 369/59.22 |
| 6,975,259 | B1 | * | 12/2005 | Jensen | 341/143 |
| 7,230,561 | B2 | * | 6/2007 | Lee | 341/172 |
| 7,375,572 | B2 | * | 5/2008 | Lin et al. | 327/307 |
| 7,385,443 | B1 | * | 6/2008 | Denison | 330/9 |
| 2002/0083605 | A1 | * | 7/2002 | Blank et al. | 33/356 |
| 2003/0214423 | A1 | * | 11/2003 | Lee et al. | 341/118 |
| 2007/0273411 | A1 | * | 11/2007 | Harris et al. | 327/103 |

* cited by examiner

*Primary Examiner*—Linh V Nguyen

(57) ABSTRACT

Apparatuses, methods, and systems for compensating baseline offset in a read channel of an analog storage device. The apparatus generally includes an AC-coupling circuit configured to transfer an analog signal from an analog storage device to the read channel, a configurable current device coupled to the AC-coupling circuit, comparator coupled to the AC-coupling circuit, and logic coupled to the configurable current device and the comparator, wherein the logic is adapted to configure said current device in response to an output of at least one of the AC-coupling circuit and the comparator. The method generally includes the steps of coupling an analog storage device and the read channel with an AC-coupling circuit, detecting a baseline or a component of an analog signal at a node downstream from the AC-coupling circuit, and configuring a current device to modify the analog signal in response to detecting the baseline or a component of the analog signal, wherein the current device is coupled to a node downstream from the AC-coupling circuit and upstream from a signal processor configured to operate on the analog signal.

31 Claims, 13 Drawing Sheets

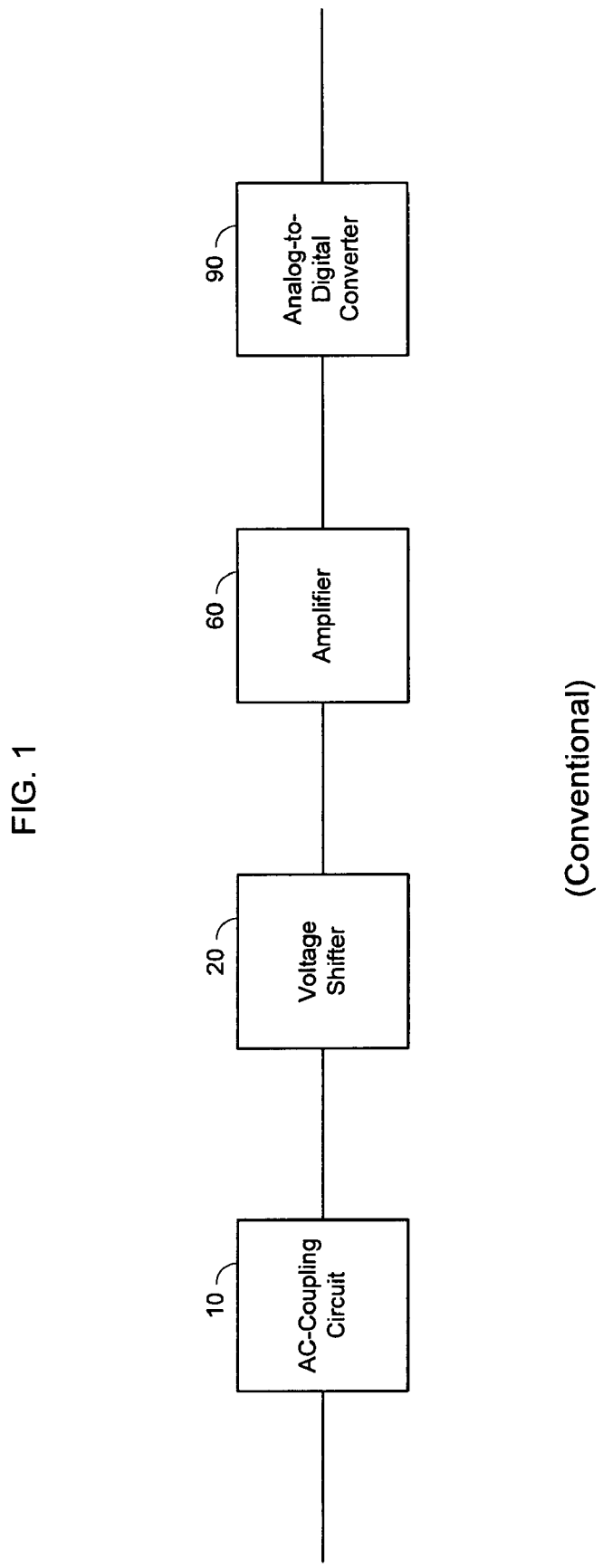
FIG. 1
(Conventional)

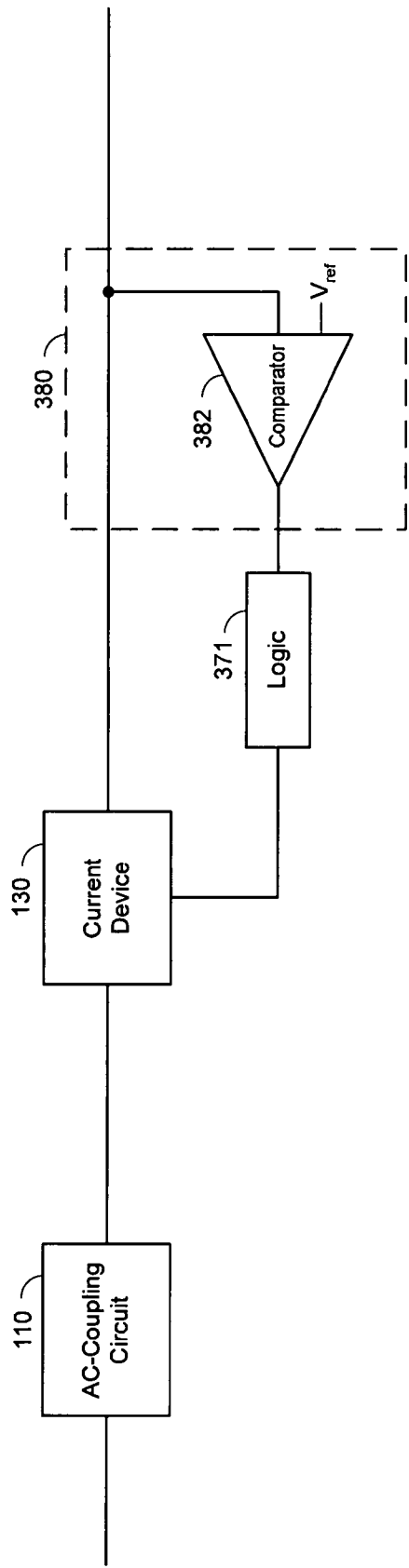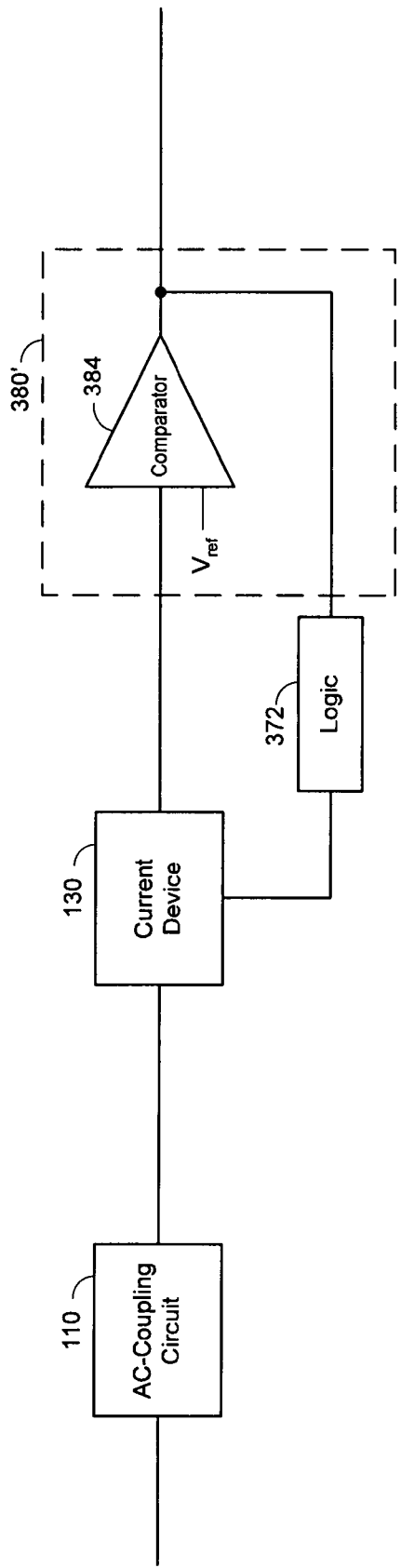

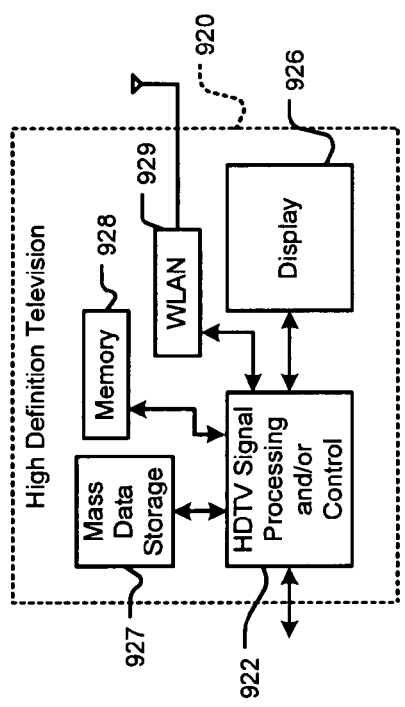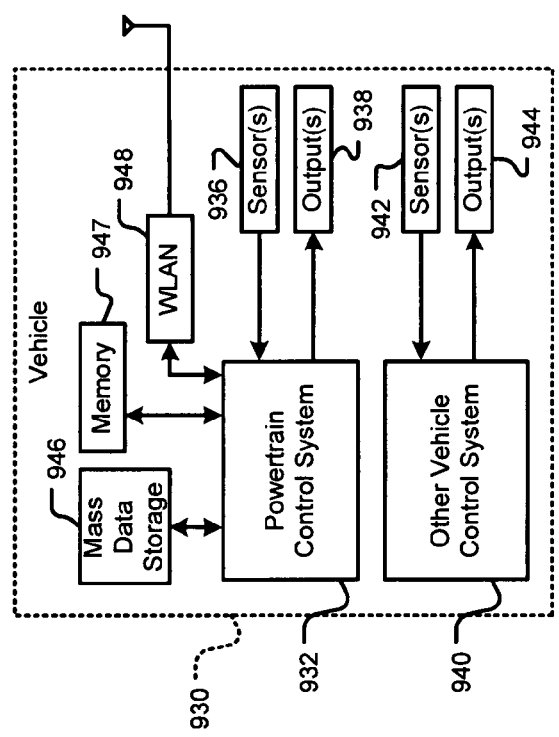

APPARATUS, METHOD, AND SYSTEM FOR CORRECTION OF BASELINE WANDER

RELATED APPLICATIONS

This application claims the benefit of U.S. Provisional Application No. 60/798,630, filed on May 8, 2006, incorporated herein by reference in its entirety.

FIELD OF THE INVENTION

The present invention generally relates to the field of analog recording systems. More specifically, embodiments of the present invention pertain to an apparatus and a method for compensating baseline offset in a read channel of an analog recording system.

DISCUSSION OF THE BACKGROUND

Analog recording systems, for example, magnetic hard drives, are used in a wide variety of commercial products, such as digital video recorders, laser printers, Voice-Over-IP devices, high definition televisions, vehicle control systems, cellular phones, storage systems (e.g., redundant arrays of independent disks, or RAIDs), desktop and laptop computers, portable audio players, personal data assistants, and digital cameras. In addition to magnetic hard drives, other analog recording systems, such as optical and magneto-optical drives, are similarly used in numerous commercial applications. Commercial products are growing more complex, and as they do so, there continues to be a growing requirement for greater storage capacities. For example, the storage capacity of commercially available magnetic hard drives for desktop computers has grown from 2 gigabytes to over 200 gigabytes in the last decade.

One method of increasing storage capacity in a recording system while maintaining substantially the same or smaller form factor includes increasing the density of the storage medium. In magnetic hard drives, the density may be increased by reducing the magnetic grain size and/or the bit size. However, in some conventional longitudinal designs (where the magnetic grains and/or bits are horizontally aligned), the storage medium densities are approaching the super-paramagnetic limit (i.e., when the energy required to change the magnetic moment of a magnetic grain approaches the ambient thermal energy). To overcome such challenges, some manufacturers are beginning to use perpendicular designs, where the magnetic grain and/or bits are vertically aligned.

While perpendicular designs can achieve greater storage medium densities, they may also require additional circuitry in the read channel. Referring now to FIG. 1, a conventional read channel of an analog recording system may comprise an AC-coupling circuit 10, an amplifier 60, and an analog-to-digital converter (ADC) 90. In some analog recording systems, the AC-coupling circuit is the first element in the analog front end of the read channel and is connected to an element which reads data from the storage medium (e.g., a magnetic read head or a read head pre-amp). Generally, AC-coupling circuits are used to minimize voltage offsets between two or more components. For example, AC-coupling circuit 10 may reduce an offset between the read head pre-amp and the read channel circuitry.

However, and in contrast to longitudinal designs where the output of a read head corresponds to magnetic field transitions on the recording medium, a read head output in a perpendicular design corresponds to the polarization of the magnetic field. As a result, perpendicular designs have the potential of generating a constant, or nearly constant, signal output when the recording medium is uniformly magnetized. Such a constant signal output may result in the baseline (or median) output of the AC-coupling circuit drifting (or wandering) over time, which leads to a voltage offset between the read head and the read channel.

If not corrected, this baseline offset may cause amplifier 60 or ADC 90 to become saturated or otherwise operate outside an optimal parametric range, which may result in an erroneous data reading. One conventional approach to adjusting the baseline of the signal is to include a voltage shifter 20 in series with the AC-coupling circuit 10 and the ADC 90. However, such a series approach may introduce propagation delay through the analog front end of the read channel.

Therefore, it would be desirable to provide a system that is able to adjust the baseline of an analog signal in the analog front end of a read channel without introducing propagation delay.

SUMMARY OF THE INVENTION

Embodiments of the present invention relate to an apparatus and a method for compensating baseline offset in a read channel. An apparatus generally comprises a configurable current device in parallel with the analog signal path of the read channel. The current device may be configured in response to the output of the AC-coupling circuit and/or the output of comparator.

In one aspect, the invention concerns an apparatus for compensating baseline offset in a read channel, comprising: an AC-coupling circuit configured to transfer an analog signal from an analog storage device to a read channel; a configurable current device coupled to the AC-coupling circuit; a comparator coupled to the AC-coupling circuit; and logic coupled to the configurable current device and the comparator, wherein the logic is adapted to configure the configurable current device in response to an output of at least one of the AC-coupling circuit and the comparator. In some embodiments, the comparator comprises converting circuitry (e.g., a converter).

In another aspect, the invention concerns a method of compensating baseline offset in a read channel, comprising: coupling an analog storage device and a read channel with an AC-coupling circuit; detecting a baseline or a component of an analog signal at a node downstream from the AC-coupling circuit; and configuring a current device to modify the analog signal in response to detecting the baseline or a component of the analog signal, wherein the current device is coupled to a node downstream from the AC-coupling circuit and upstream from a signal processor configured to operate on the analog signal.

Alternatively, the method comprises the steps of: reading data from an analog storage device to generate an analog signal for transmission in the read channel; comparing the analog signal to a reference or converting the analog signal to a digital signal; and configuring a current to be sourced to and/or sunk from the analog signal in response to an outcome of the comparing step or the digital signal.

The present invention advantageously provides an apparatus and method for compensating baseline offset (or baseline "wander") in a read channel. Since the baseline adjustment is generally made in parallel with the signal path (e.g., using a feedback mechanism), the deleterious effects of doing such an adjustment is minimized. In addition, current or charge based adjustments are more power efficient and provide greater adjustment ranges than alternative methods.

These and other advantages of the present invention will become readily apparent from the detailed description of preferred embodiments below.

BRIEF DESCRIPTION OF THE DRAWINGS

FIG. 1 is a diagram showing a conventional analog front end of a read channel.

FIG. 4A is a diagram showing an exemplary implementation of the converting and/or comparing circuitry in accordance with the present invention.

FIG. 4B is a diagram showing another exemplary implementation of the converting and/or comparing circuitry in accordance with the present invention.

FIGS. 10A-10G are diagrams showing exemplary systems in which the present invention may be used.

DETAILED DESCRIPTION OF THE PREFERRED EMBODIMENTS

Figure 2:
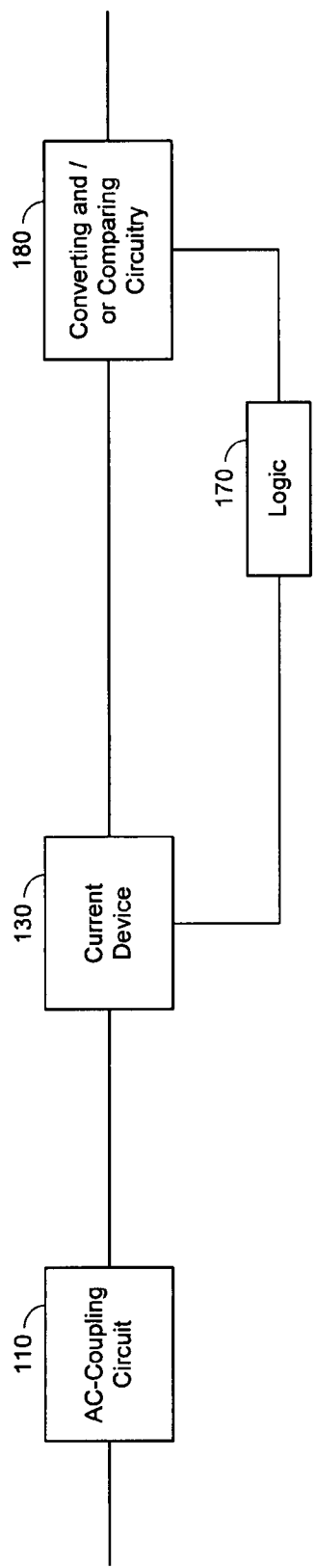
FIG. 2 is a diagram showing an apparatus for compensating baseline offset in accordance with the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "signal(s)" and "waveform(s)" may be used interchangeably, however, these terms are also given their art recognized meanings. Also, for convenience and simplicity, the terms "baseline", "baseline voltage", and "baseline signal" may be used interchangeably, as well as the terms "baseline offset", "baseline wander", "baseline drift", "DC wander", and "DC drift", and in general, use of one such form generally includes the others, unless the context of the use unambiguously indicates otherwise. The terms "node(s)", "input(s)", "output(s)", and "port(s)" may be used interchangeably, as may the terms "connected to", "coupled with", "coupled to", and "in communication with" (which terms also refer to direct and/or indirect relationships between the connected, coupled and/or communicating elements, unless the context of the term's use unambiguously indicates otherwise). However, these terms are also given their art recognized meanings.

In one aspect, the invention concerns an apparatus for compensating baseline offset in a read channel, comprising an AC-coupling circuit configured to transfer an analog signal from an analog storage device to a read channel; a configurable current device coupled to the AC-coupling circuit; comparator coupled to the AC-coupling circuit; and logic coupled to the configurable current device and the comparator, wherein the logic is adapted to configure the configurable current device in response to an output of at least one of the AC-coupling circuit and the comparator.

In another aspect, the invention concerns a method of compensating baseline offset in a read channel, comprising coupling an analog storage device and a read channel with an AC-coupling circuit; detecting a baseline or a component of an analog signal at a node downstream from the AC-coupling circuit; and configuring a current device to modify the analog signal in response to detecting the baseline or a component of the analog signal, wherein the current device is coupled to a node downstream from the AC-coupling circuit and upstream from a signal processor configured to operate on the analog signal.

Alternatively, the method comprises the steps of: reading data from an analog storage device to generate an analog signal for transmission in the read channel; comparing the analog signal to a reference or converting the analog signal to a digital signal; and configuring a current to be sourced to and/or sunk from the analog signal in response to an outcome of the comparing step or the digital signal.

The invention, in its various aspects, will be explained in greater detail below with regard to exemplary embodiments.

An Exemplary Apparatus for Compensating Baseline Offset

In one embodiment, an apparatus for compensating baseline offset in a read channel includes an AC-coupling circuit configured to transfer an analog signal from an analog storage device to a read channel; a configurable current device coupled to the AC-coupling circuit; comparator coupled to the AC-coupling circuit; and logic coupled to the configurable current device and the comparator, wherein the logic is adapted to configure the configurable current device in response to an output of at least one of the AC-coupling circuit and comparator. In some embodiments, the comparator comprises a converter (e.g., an analog-to-digital converter).

Referring to FIG. 2, the front end of a read channel may include an AC-coupling circuit 110, a configurable current device 130, logic 170, and comparator/converter 180. Although not shown, there may be additional elements, such as amplifiers, buffers, or other elements, coupled between the AC-coupling circuit 110 and the comparator and/or converter circuit 180. However the invention does not require, nor explicitly exclude, other elements coupled to the circuit. As such, comparator/converter 180 may be directly and/or indirectly coupled to AC-coupling circuit 110. Furthermore, comparator/converter 180 may be directly and/or indirectly coupled to logic 170 which itself may be directly and/or indirectly coupled to the configurable current device 130.

The AC-coupling circuit 110 may be configured to receive an analog signal. In one example, this analog signal may be derived from a read head of an analog storage device such as a hard disk, CD-ROM, DVD, etc. AC-coupling circuit 110 may be coupled directly to the read head, or, there may be other devices which operate on the signal between the read head and the AC-coupling circuit 110 (e.g., a pre-amp). Configurable current device 130 may be coupled to receive an output from AC-coupling circuit 110 and provide an input to comparator 180. Further, configurable current device 130 may be configured in parallel with the analog signal path (such that the input node and the output node of the configurable current device are the same node) or in series with the signal path (such that there is at least one element between the input node and the output node). Configurable current device 130 may further be coupled to logic 170. Converting and/or comparing circuitry 180 can be configured to convert the analog signal from AC-coupling circuit 110 into a discrete (e.g., single bit) signal or multi-bit digital signal. Thus, in some embodiments, converting and/or comparing circuitry 180 comprises an analog-to-digital converter. Logic 170 may be configured to receive the discrete signal output from comparator/converter 180, determine the presence of a baseline offset, and configure (e.g., provide a bias signal to) current device 130 in response thereto.

Logic 170 may further be configured to output one or more discrete digital or analog signals to current device 130. Logic 170 may output "n" number of discrete signals each having "s" states, resulting in s$^n$ operating states of configurable current device 130. For example, if logic 170 is configured to output three binary signals (i.e., "n" equals three and "s" equals two), the configurable current device 130 may have or comprise eight operating states. Configurable current device 130 and/or logic 170 may further comprise one or more encoders, decoders, multiplexers, and/or de-multiplexers for purposes of placing the configurable current device 130 in a specific operating state. The design and implementation of such encoders, decoders, multiplexers, and/or de-multiplexers are known to those in the art. Alternatively, logic 170 may output "n" number of analog signals for configuring current device 130. In this example, the current through configurable current device 130 corresponds to or is proportional to a value of the analog output signal from logic 170.

In one implementation, logic 170 comprises digital logic, and the apparatus of the present invention may further comprise a digital-to-analog converter (not shown in FIG. 2) coupled to the configurable current device 130 and logic 170. The digital-to-analog converter may be configured to output an analog signal to the configurable current device 130 corresponding to a digital output signal of logic 170. The design and implementation of such digital-to-analog converters are also known to those in the art.

Figure 3:
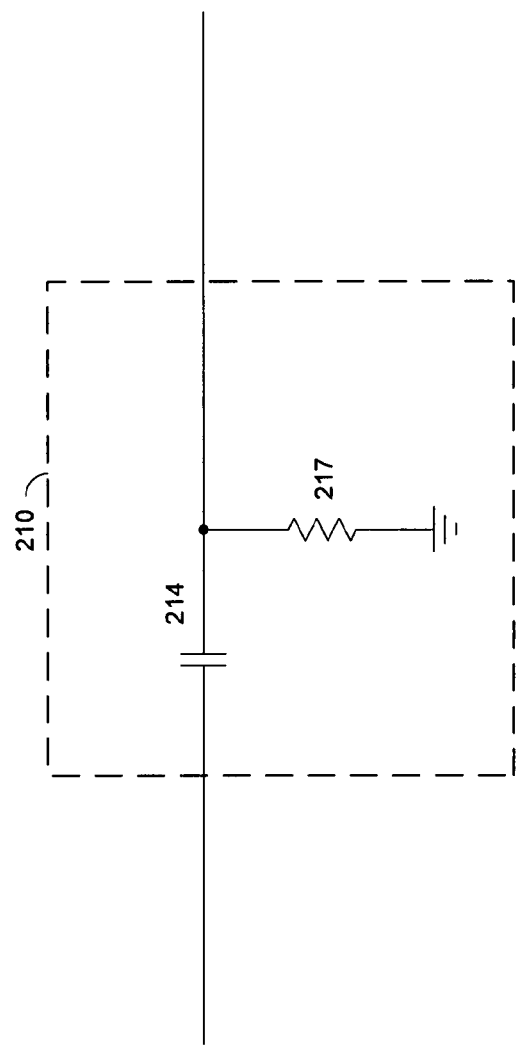
FIG. 3 is a diagram showing an exemplary implementation of the AC-coupling circuit in accordance with the present invention.

FIG. 3 shows an exemplary AC-coupling circuit 210 suitable for use in the apparatus of FIG. 2. The AC-coupling circuit 210 may comprise a high pass RC filter. In one implementation, AC-coupling circuit 210 may include an input coupled to a first terminal of a capacitor 214, an output coupled to both a second terminal of the capacitor 214 and a first terminal of a resistor 217, and a common node coupled to a second terminal of the resistor 217. The common node may have a predetermined voltage (e.g., a ground potential, a reference voltage, etc.).

In another implementation, and referring back to FIG. 2, AC-coupling circuit 110 (and thus the analog front end of the read channel) may provide a differential output to minimize common mode noise. Thus, AC-coupling circuit 110, configurable current device 130, and comparator 180 may be configured to operate on a differential signal.

Figure 4C:
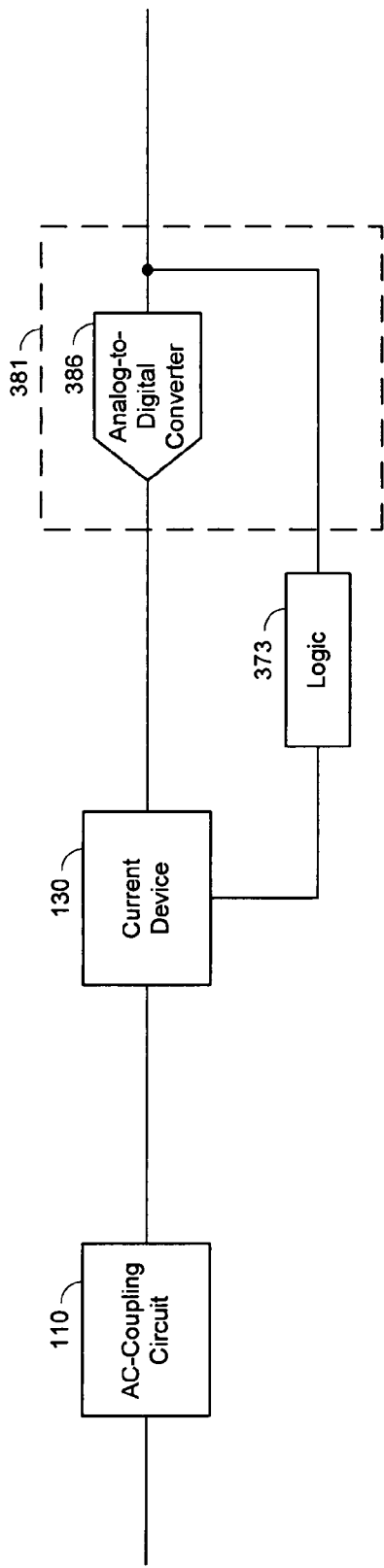
FIG. 4C is a diagram showing yet another exemplary implementation of the converting and/or comparing circuitry in accordance with the present invention.

Referring now to FIGS. 4A-D, the comparator may comprise a configurable voltage comparator and/or an analog-to-digital converter (ADC). In one implementation, and as shown in FIG. 4A, converting and/or comparing circuitry 380 may comprise a configurable voltage comparator 382 configured to compare the voltage of the analog signal from the AC-coupling circuit 110 to a pre-determined voltage (Vref), from a conventional voltage generator, a selectable resistor matrix, or a configurable voltage supply (the latter two of which may provide an electrically configurable voltage). The output, or result of the comparison, may be one or more discrete signals.

Converting and/or comparing circuitry 380 may further comprise multiple configurable voltage comparators, each configured to compare the analog signal to one or more voltages. The output of comparator 382 may be coupled to logic 371 (such as Boolean logic), or, and as shown in FIG. 4B, coupled to logic 372 and other devices downstream in the read channel.

Figure 4D:
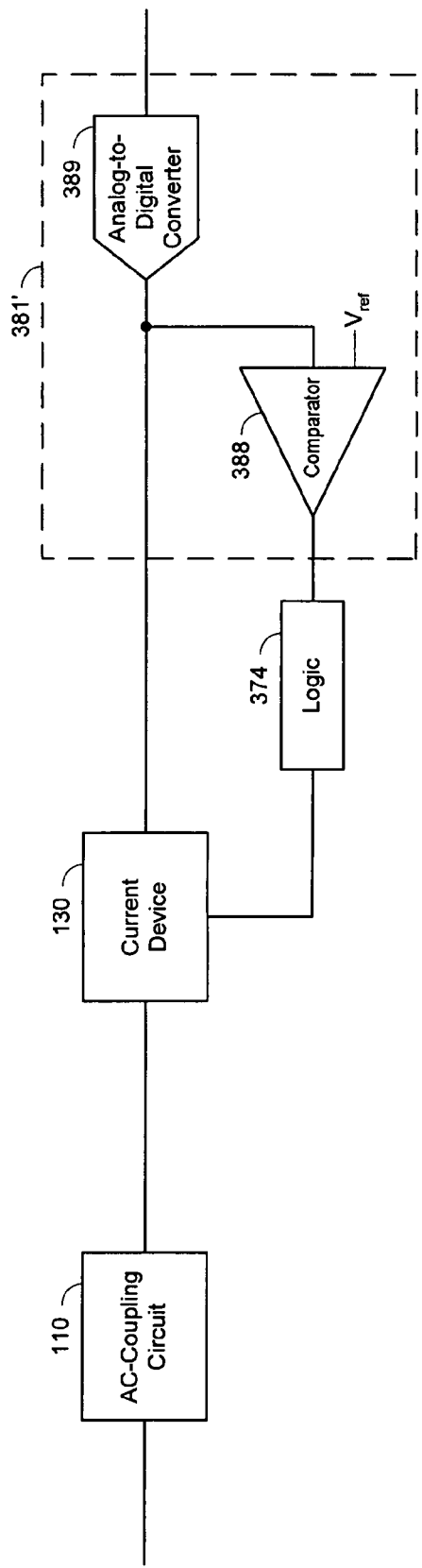
FIG. 4D is a diagram showing another implementation of the converting and/or comparing circuitry in accordance with the present invention.

In another implementation, and as shown in FIG. 4C, converting and/or comparing circuitry 381 may comprise an analog-to-digital converter 386 for converting the analog signal from the AC-coupling circuit 110 into a digital signal. The output of ADC 386 may be coupled to logic 373 and also may further be coupled to other devices in the read channel. In yet another implementation, and as shown in FIG. 4D, converting and/or comparing circuitry 381' may include both a configurable voltage comparator 388 and an ADC 389. The design, selection, and implementation of such comparator and/or ADC circuits are known to those in the art.

Figure 5:
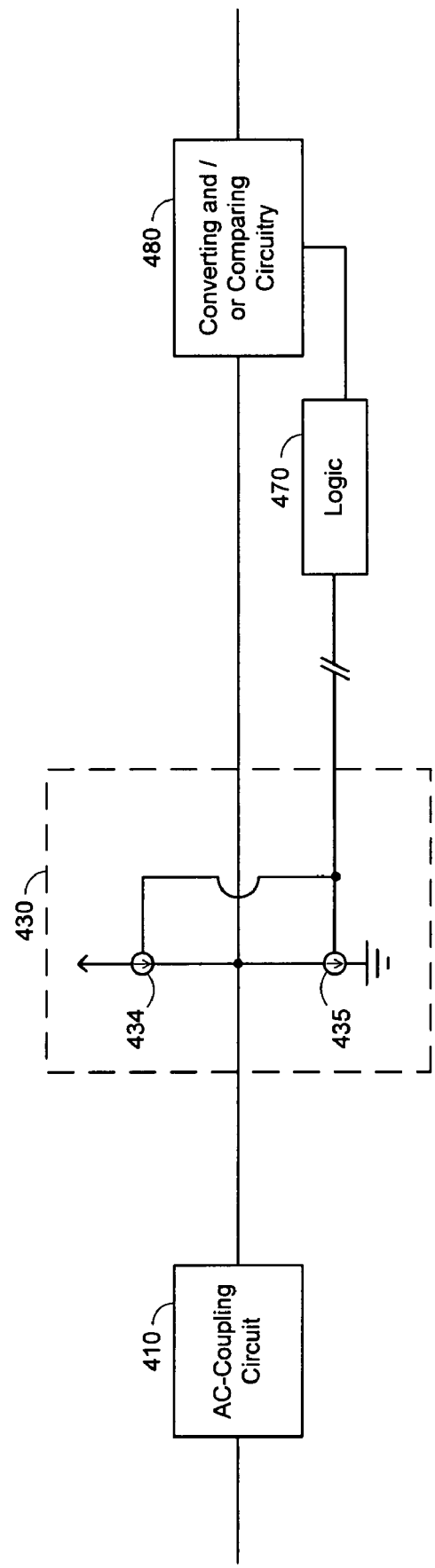
FIG. 5 is a diagram showing an exemplary current device for the present apparatus.

Referring now to FIG. 5, and in another implementation, a configurable current device may comprise an active current source and/or sink coupled to a node between the AC-coupling circuit and the converting and/or comparing circuitry. The active current source and/or sink may be configured to receive an analog and/or a digital signal from logic 470, and is configured to source and/or sink current in response thereto. In one implementation, the configurable current device 430 may comprise an active current source 434 coupled to a node between AC-coupling circuit 410 and converting and/or comparing circuitry 480. In another implementation, configurable current device 430 may comprise an active current sink 435 coupled to a node between AC-coupling circuit 410 and converting and/or comparing circuitry 480. In yet another implementation, configurable current device 430 may comprise both an active current source 434 and an active current sink 435 coupled to a node between the AC-coupling circuit 410 and the converting and/or comparing circuitry 480. Such a configuration allows more precise adjustments to the analog signal than conventional methods provide.

Active current source 434 and/or active current sink 435 may be configured by, and coupled to, an output of or from logic 470. In one implementation, the configurable current device 430 may be configured in response to an output of logic 470 and adapted to maintain a variable current corresponding to one or more characteristics of AC-coupling circuit 410 and/or an analog signal from AC-coupling circuit 410. AC-coupling circuit 410 may comprise a capacitor and a resistor (as shown in the exemplary diagram of FIG. 3), and active current source 434 and/or active current sink 435 may be configured to source and/or sink a current for a variable magnitude and time corresponding to the equation:

$$C*dv=I*dt$$

where "I" represents the magnitude of the current, "dt" represents the time that the current device is activated, "C" represents the capacitance of the AC-coupling circuit 410, and "dv" represents the voltage change across the two terminals of the capacitor. By such a variable current approach, charge can be injected into and/or removed from the AC-coupling circuit 410 to precisely adjust the baseline of the analog signal.

Further, the configurable current device may be configured to maintain a variable current in the configurable current device corresponding to one or more characteristics of the analog signal or the AC-coupling circuit. In one implementation, configurable current device 430 may be configured in response to an output of logic 470 and adapted to maintain a pulsed current in the configurable current device, wherein the magnitude, frequency, and/or pulse width may be varied with respect to one or more characteristics of the analog signal or the AC-coupling circuit. Such characteristics may include any baseline offset detected by converting and/or comparing circuitry 480 and/or logic 470. For example, logic 470 may determine the presence of a 1.0 volt baseline offset to be corrected and AC-coupling circuit may comprise a 10 uF capacitor. By applying a current of 1.0 mA for 10 ms, the baseline offset can be eliminated (since 10 uF*1.0 volt=1.0 mA*10 ms). Similarly, a 10 mA current may be injected for 1.0 ms. In yet another example, a current of 1.5 mA may be sourced for 10 ms, and then a current of 0.5 mA may be sunk for 10 ms. By making current adjustments at a rate faster than the discharge rate of the capacitor inside the AC-coupling circuit, precise adjustments to the baseline of an analog signal can be made without significantly affecting the encoded data portion of the analog signal. In one implementation, the pulsed current may have a pulse width less than the time constant of the AC-coupling circuit. For example, a pulse width may be about 10 to 1000 times less than a time constant of the AC-coupling circuit.

Figure 6:
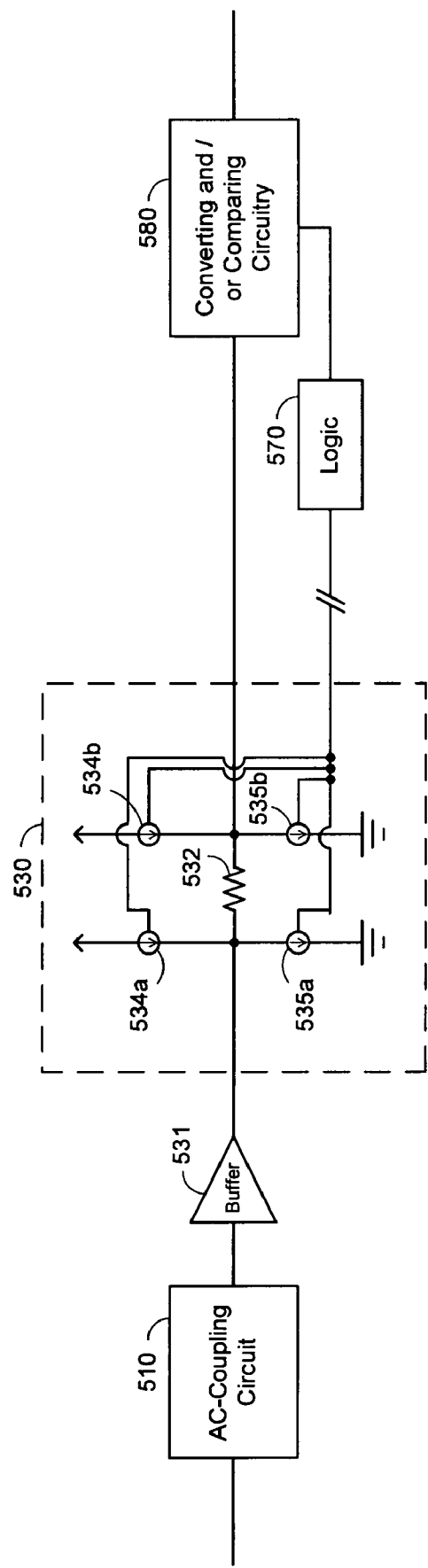
FIG. 6 is a diagram showing an alternative exemplary current device for the present apparatus.

Referring now to FIG. 6, the configurable current device may include multiple active current sources and/or sinks in addition to other devices. In one implementation, configurable current device 530 may comprise a buffer 531 coupled to an output of AC-coupling circuit 510, a resistor 532 coupled at a first terminal to an output of buffer 531 and at a second terminal to an input of converting and/or comparing circuitry 580, and an active current source and/or sink coupled to the first terminal and/or second terminal of resistor 532. Buffer 531 prevents injected current from flowing back into the AC-coupling circuit 510. The active current sources 534a and 534b and/or active current sinks 535a and 535b may be configured to create a current through resistor 532, generating a voltage drop and/or gain corresponding to the detected baseline offset.

In one implementation, configurable current device 530 may be configured in response to an output of logic 570 and adapted to maintain a substantially constant current in the configurable current device corresponding to one or more characteristics of the analog signal. For example, the configurable current device 530 may include active current source 534a and active current sink 535b. If a positive baseline offset is detected, the configurable current device 530 may be configured to provide a current from active current source 534a, through resistor 532, to active current sink 535b. This current would reduce the baseline offset of the analog signal by a value given by:

$$I*R$$

where I represents the magnitude of the configured current and R represents the value of resistor 532. In a similar fashion, configurable current device 530 may include active current source 534b and active current sink 535a for increasing the baseline offset of the analog signal. In yet another example, and as shown in FIG. 6, configurable current device 530 may include active current source 534a and active current sink 535b for reducing the baseline offset, and, active current source 534b and active current sink 535a for increasing the baseline offset.

Figure 7:
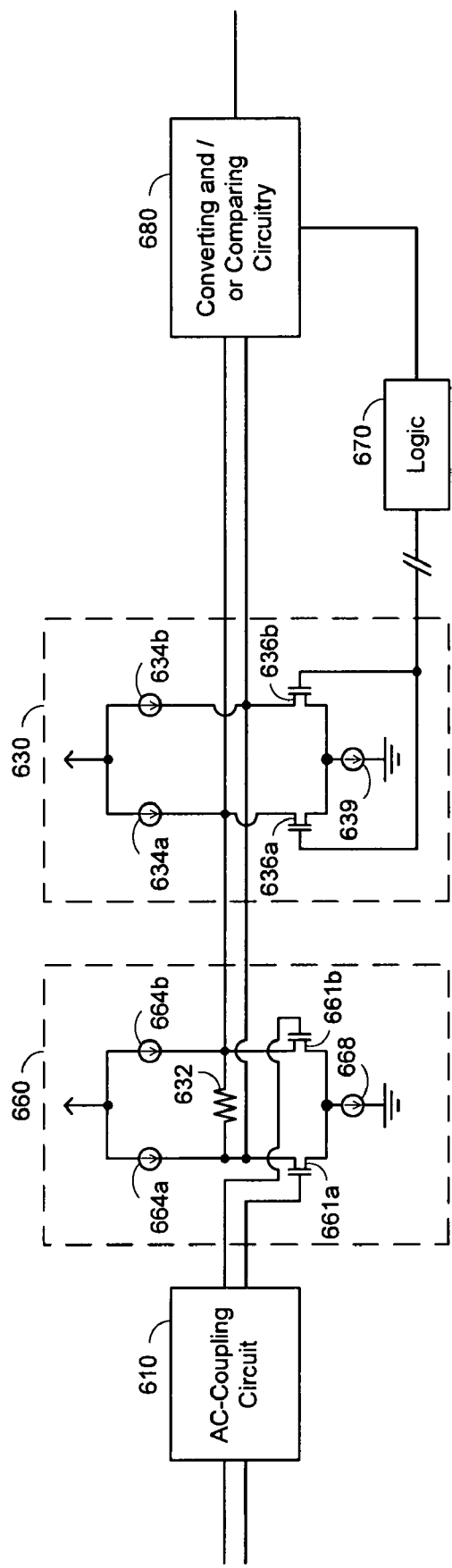
FIG. 7 is a diagram showing an exemplary apparatus of the present invention employing an amplifier.

As discussed above, additional elements may be coupled between the AC-coupling circuit and the converting and/or comparing circuitry. In another implementation, an amplifier may be coupled to an output of the AC-coupling circuit. In a further implementation, the configurable current device may comprise an active current source and/or sink coupled to an output of the amplifier. As shown in FIG. 7, a differential pair amplifier 660 may be coupled between AC-coupling circuit 610 and converting and/or comparing circuitry 680. The amplifier may comprise current sources 664a and 664b, current sink 668, transistors 661a and 661b, and load resistor 632. In one embodiment, the configurable current device 630 may also be placed between the AC-coupling circuit 610 and converting and/or comparing circuitry 680, but downstream from the differential pair amplifier 660. The configurable current device 630 may comprise a current source 634a, transistor 636a, and a current sink 639 for injecting current at a node on one side of load resistor 632. Configurable current device 630 may further comprise current source 634b and transistor 636b for injecting current on a second node of load resistor 632. Transistors 636a and 636b may be coupled to logic 670, wherein logic 670 configures the transistors in response to the output of the converting and/or comparing circuitry 680.

Figure 8:
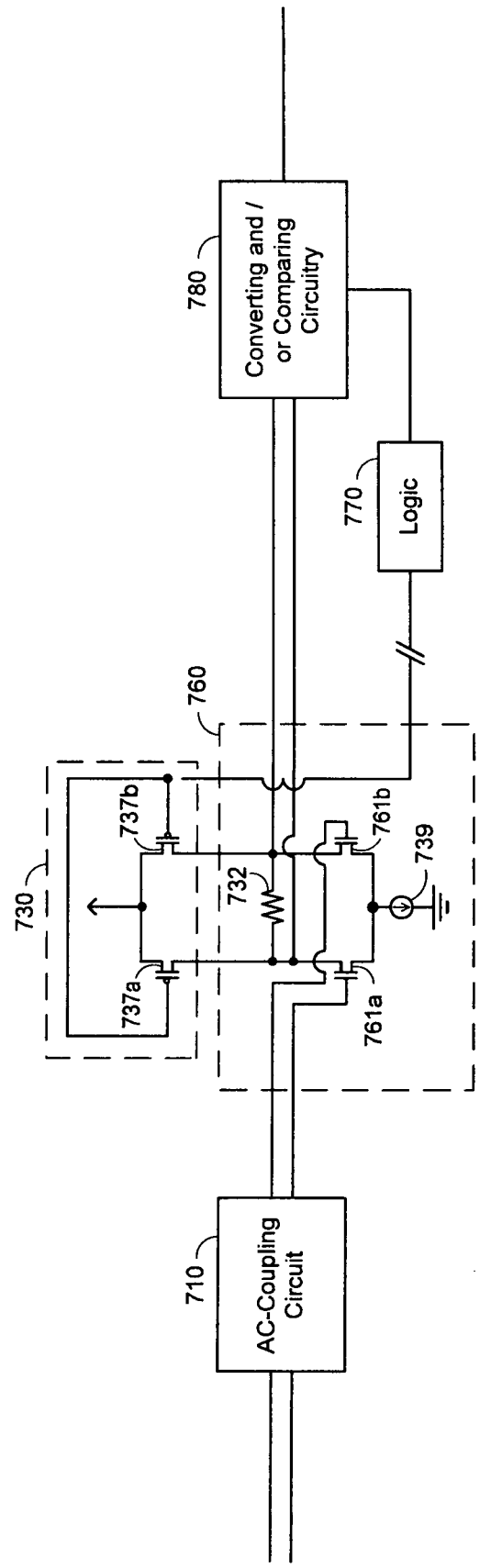
FIG. 8 is a diagram showing another exemplary apparatus of the present invention employing another amplifier.

In another implementation, the configurable current device may be configured to limit a current in an amplifier. For example, as shown in FIG. 8, a differential pair amplifier 760 may comprise transistors 761a and 761b, current sink 739, load resistor 732. Configurable current device 730 may supply the current for one and/or both sides of the differential pair amplifier 760. Configurable current device 730 may comprise transistors 737a and 737b coupled to logic 770 and configured to limit a current through one and/or both sides of the differential pair amplifier 760.

Exemplary Logic

As discussed above, logic may be coupled to the configurable current device and the converting and/or comparing circuitry. Generally, the logic may be adapted to configure the current device in response to the AC-coupling circuit and/or the converting and/or comparing circuitry. The logic may be configured to receive an output signal from the converting and/or comparing circuitry and operate on the signal so as to generate a derivative signal used as input to the configurable current device. Such operations may be performed in or using digital and analog components. Further, the logic may comprise discrete components or may be contained within a logic array element (such as a programmable logic device or field programmable gate array) or an application specific integrated circuit. While the examples below are illustrative of one or more designs and/or implementations of the logic, those skilled in the art can appreciate other designs or implementations of the logic which are adapted to configure the current device in response to an AC-coupling circuit and/or converting and or comparing circuitry within an analog storage device.

Figure 9:
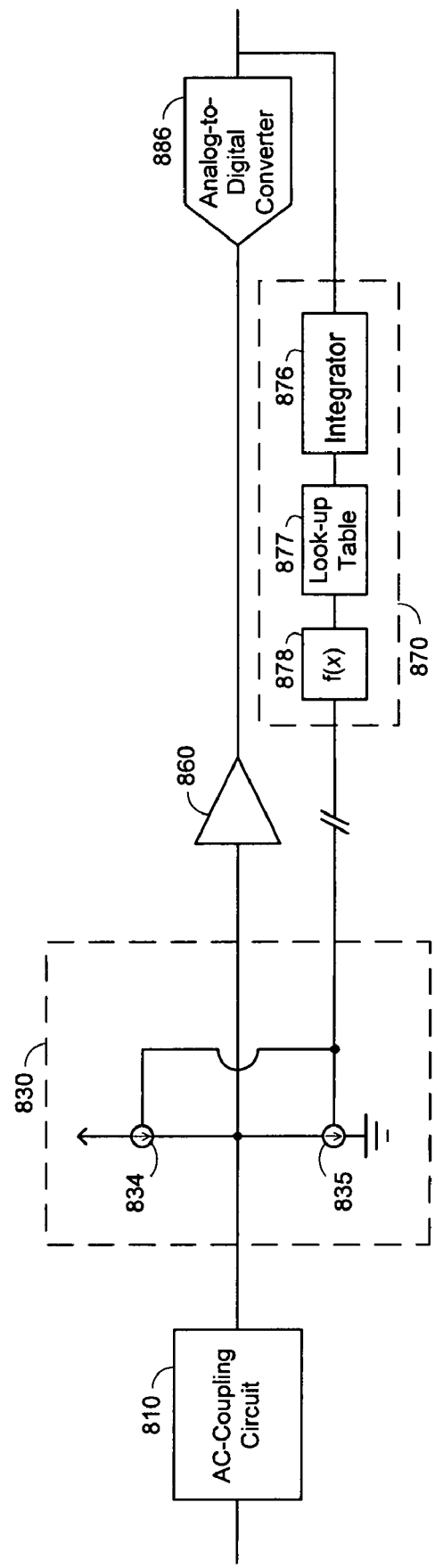
FIG. 9 is a diagram showing exemplary logic for the present invention.

In one example, and referring now to FIG. 9, logic 870 may comprise an integrator 876, a look-up-table 877, and a function block 878. Integrator 876 may be coupled to an output of an analog-to-digital converter 886 which converts the analog signal from the AC-coupling circuit 810 into a digital signal. Integrator 876 may comprise an accumulator for accumulating samples from the ADC 886 during a defined period of time (or window). Further, integrator 876 may comprise a memory element for storing the samples from the ADC 886 and a processor for integrating samples within a window from the memory element. The window size may be fixed or adjustable, depending on the status of one or more components in the read channel or in the system generally. For example, if the apparatus includes a variable gain amplifier 860 between the AC-coupling device and the analog-to-digital converter 886, the window size of integrator 876 may correspond to the gain of the amplifier. The window size may also be chosen to minimize the effects of noise. A properly chosen window size is one that can adequately filter transient noise.

The output of integrator 876 corresponds to the analog signal from the AC-coupling circuit 810 after being converted to a digital signal by ADC 886 and integrated by integrator 876. Because a baseline offset may be considered a net positive or negative voltage bias on the analog signal from the AC-coupling circuit, an integrator can accumulate the offset over a given window period. The accumulated result can then be compared to an expected result, and thus any baseline offset in the analog signal may be detected.

Look-up-table 877 may be configured to output a current device setting signal in response to the accumulated value output of integrator 876. Look-up-table 877 may comprise a memory element and a processor for operating on the memory element. In one example, look-up-table 877 contains multiple current device settings and corresponding accumulation values for comparing the output of the integrator 876. Configurable current device 830, which may comprise active current source 834 and/or active current sink 835, may be configured to source and/or sink current with characteristics determined by the current device setting signal output of look-up-table 877. The current device settings may be fixed or they may be calibrated during operation. In one example, the current device setting may be calibrated on power up of the apparatus and thereafter at pre-determined intervals (e.g., in magnetic hard drives, the current device settings may be calibrated on the initial power up and also after each sector reading). Calibration of the current device settings may consider such factors as gain of a variable gain amplifier 860, time delay of the ADC, and the response of the configurable current device.

Look-up-table 877 may directly control the configurable current device, or, a functional block 878 may further operate on the current device setting signal. Functional block 878 may receive the current device setting signal and perform mathematical operations thereon. In one example, functional block 878 may divide the value of the current device setting signal such that individual changes to the configurable current device are small. In another example, functional block 878 may filter the current device setting signal to eliminate spurious or aberrational current device settings that may be introduced by noise or improper window settings. A functional block 878 may be configured to modify the current device setting signal such that any changes to the operation of the configurable current device (i.e., current that is sourced, or, current that is sunk) are made in one or more successive steps.

The above discussion is to be understood as an exemplary implementation of logic 870. Based on the disclosure and teachings provided herein, those skilled in the art can appreciate that the above example is one of many ways to configure a current device in response to an AC-coupling circuit and/or converting and/or comparing circuitry in accordance with the present invention.

An Exemplary Method for Compensating Baseline Offset

In another embodiment, a method of compensating baseline offset in a read channel may include: coupling an analog storage device and a read channel with an AC-coupling circuit; detecting a baseline or a component of an analog signal at a node downstream from the AC-coupling circuit; and configuring a current device to modify the analog signal in response to detecting the baseline or a component of the analog signal, wherein the current device is coupled to a node downstream from the AC-coupling circuit and upstream from a signal processor configured to operate on the analog signal. Alternatively, the method may comprise the steps of: reading data from an analog storage device to generate an analog signal for transmission in the read channel; comparing the analog signal to a reference or converting the analog signal to a digital signal; and configuring a current to be sourced to and/or sunk from the analog signal in response to an outcome of the comparing step or the digital signal.

In one implementation, coupling an analog storage device and a read channel may comprise the steps of receiving a first signal from the analog storage device at a first terminal of a capacitor in the AC-coupling circuit, and transmitting a second signal to the read channel at a second terminal of the capacitor in the AC-coupling circuit. The first terminal of the capacitor may be directly coupled to the read head of the analog storage device or may be indirectly coupled to the read head. For example, the first terminal of the capacitor may be coupled to the output of an amplifier for amplifying the output of the read head. The method may further comprise coupling the second terminal of the capacitor to a first terminal of a resistor and coupling a second terminal of the resistor to a common reference voltage (e.g. a signal ground). The specific capacitor value and/or resistor value may be chosen such that the AC-coupling circuit (e.g., high pass RC filter) has a predetermined cut-off frequency. The design, selection, and implementation of such capacitors and resistors are known to those in the art.

In another implementation, the method may further comprise comparing the analog signal or a component thereof to one or more reference voltages. For example, the analog signal can be applied to one input of a comparator circuit, a reference voltage can be applied to another input of the comparator circuit, and an output of the comparator circuit can indicate a relationship between the two inputs (i.e. if the analog signal is greater than, less than, or equal to the reference voltage). Further, since the analog signal may comprise multiple spectral components (i.e. higher frequency encoded data and lower frequency baseline offset) it may be desirable to compare one or more specific spectral components of the analog signal. In one implementation, detecting the baseline or a component of the analog signal includes filtering the analog signal or a component thereof. For example, the analog signal may be filtered with a low pass filter to obtain a signal representative of the lower frequency baseline offset. This signal can then be compared to a reference voltage, as discussed above, to determine the magnitude of the baseline offset.

In another implementation, detecting the baseline or a component of the analog signal may include converting the analog signal or a component thereof into a digital signal. The conversion method may include sampling the analog signal (or a component thereof as discussed above) and converting it into a digital signal representative of the analog signal. In one method, a comparator may be used. The digital signal output may indicate the magnitude of the sampled signal relative to a first reference value (i.e., the sampled signal is greater than, less than, or equal to the first reference value). Again, since the analog signal may comprise multiple spectral components (i.e. higher frequency encoded data and lower frequency baseline offset) it may be desirable to compare one or more specific spectral components of the analog signal. Detecting the baseline or a component of the analog signal may include filtering the analog signal or a component thereof. For example, the analog signal may be filtered with a low pass filter to obtain a signal representative of the lower frequency baseline offset. In another method, an analog-to-digital converter may be used to convert the analog signal or a component thereof into a digital signal. The digital signal may indicate that the sampled signal is greater than, less than, or equal to a scaled value of a first reference value. In a further implementation, the method may also include comparing the digital signal or component thereof to one or more other reference values. For example, logic, computing, processing or other element may filter or otherwise transform the digital signal and compare the result to other reference values.

When the baseline or a component of the analog signal has been detected, the analog signal may be adjusted by a current device coupled between an AC-coupling circuit and the signal processor. The current device may be configured corresponding to one or more characteristics of the detected baseline or component of the analog signal. In one implementation, a method of configuring the current device to modify the analog signal may comprise sinking and/or sourcing current at a node between the AC-coupling circuit and the signal processor. For example, if the AC-coupling circuit comprises a high pass RC filter, the analog signal voltage may be reduced by a value given by:

$$(I*dt)/C$$

where I represents the magnitude of the current, dt represents the time that the current device is activated, and C represents the capacitance of the AC-coupling circuit. The current may be fixed or may have a variable magnitude. Further, the current may be pulsed, having a variable magnitude, frequency, and pulse width.

In another implementation, a method of configuring the current device to modify the analog signal may include sinking and/or sourcing current through a resistor coupled to the AC-coupling circuit and the signal processor. By injecting current through the resistor, the analog signal may be adjusted by:

$$I*R$$

where I represents the magnitude of the configured current and R represents the value of resistor.

In yet another implementation, a method of configuring the current device to modify the analog signal may include limiting a current through an amplifier coupled to the AC-coupling circuit and the signal processor. For example, a differential amplifier may be coupled to an AC-coupling circuit and a signal processor. A current device may include a current limiting device, such as a transistor, coupled to one or more nodes in the differential amplifier. By limiting the current through one or more nodes in the amplifier, the output of the differential pair amplifier, and thus the analog signal, may be adjusted.

Exemplary Systems Using the Present Circuit

In a further aspect of the invention, a system may comprise the present apparatus or circuit for charge based correction of baseline wander. Various exemplary implementations of the present invention are shown in FIGS. 10A-10G.

Figure 10A:
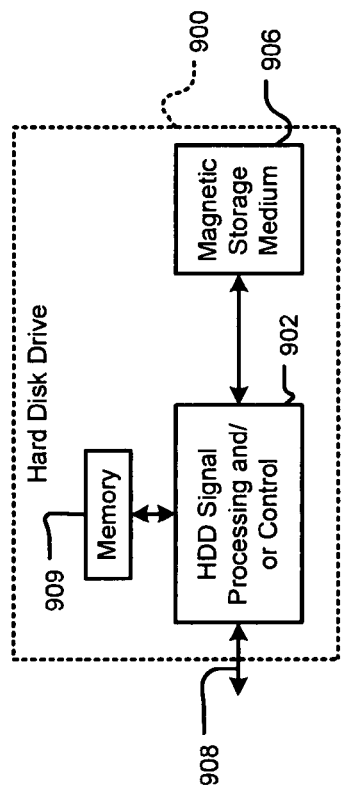

Referring now to FIG. 10A, the present invention can be implemented in a hard disk drive (HDD) 900. The present invention may implement either or both signal processing and/or control circuits, which are generally identified in FIG. 10A at 902. In some implementations, the signal processing and/or control circuit 902 and/or other circuits (not shown) in the HDD 900 may process data, perform coding and/or encryption, perform calculations, and/or format data that is output to and/or received from a magnetic storage medium 906.

The HDD 900 may communicate with a host device (not shown) such as a computer, mobile computing devices such as personal digital assistants, cellular phones, media or MP3 players and the like, and/or other devices via one or more wired or wireless communication links 908. The HDD 900 may be connected to memory 909 such as random access memory (RAM), low latency nonvolatile memory such as flash memory, read only memory (ROM) and/or other suitable electronic data storage.

Figure 10B:
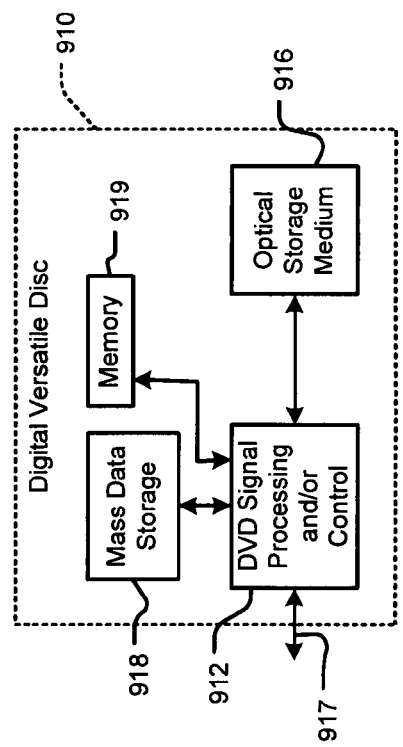

Referring now to FIG. 10B, the present invention can be implemented in a digital versatile disc (DVD) drive 910. The present invention may implement either or both signal processing and/or control circuits, which are generally identified in FIG. 10B at 912, and/or mass data storage 918 of the DVD drive 910. The signal processing and/or control circuit 912 and/or other circuits (not shown) in the DVD 910 may process data, perform coding and/or encryption, perform calculations, and/or format data that is read from and/or data written to an optical storage medium 916. In some implementations, the signal processing and/or control circuit 912 and/or other circuits (not shown) in the DVD 910 can also perform other functions such as encoding and/or decoding and/or any other signal processing functions associated with a DVD drive.

The DVD drive 910 may communicate with an output device (not shown) such as a computer, television or other device via one or more wired or wireless communication links 917. The DVD 910 may communicate with mass data storage 918 that stores data in a nonvolatile manner. The mass data storage 918 may include a hard disk drive (HDD). The HDD may have the configuration shown in FIG. 10A. The HDD may be a mini HDD that includes one or more platters having a diameter that is smaller than approximately 1.8". The DVD 910 may be connected to memory 919 such as RAM, ROM, low latency nonvolatile memory such as flash memory and/or other suitable electronic data storage.

Referring now to FIG. 10C, the present invention can be implemented in a high definition television (HDTV) 920. The present invention may implement either or both signal processing and/or control circuits, which are generally identified in FIG. 10C at 922, a WLAN interface and/or mass data storage of the HDTV 920. The HDTV 920 receives HDTV input signals in either a wired or wireless format and generates HDTV output signals for a display 926. In some implementations, signal processing circuit and/or control circuit 922 and/or other circuits (not shown) of the HDTV 920 may process data, perform coding and/or encryption, perform calculations, format data and/or perform any other type of HDTV processing that may be required.

The HDTV 920 may communicate with mass data storage 927 that stores data in a nonvolatile manner such as optical and/or magnetic storage devices. At least one HDD may have the configuration shown in FIG. 10A and/or at least one DVD may have the configuration shown in FIG. 10B. The HDD may be a mini HDD that includes one or more platters having a diameter that is smaller than approximately 1.8". The HDTV 920 may be connected to memory 928 such as RAM, ROM, low latency nonvolatile memory such as flash memory and/or other suitable electronic data storage. The HDTV 920 also may support connections with a WLAN via a WLAN network interface 929.

Referring now to FIG. 10D, the present invention can be implemented in a control system of a vehicle 930, a WLAN interface and/or mass data storage of the vehicle control system. In some implementations, the present invention implement a powertrain control system 932 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 940 of the vehicle 930. The control system 940 may likewise receive signals from input sensors 942 and/or output control signals to one or more output devices 944. In some implementations, the control system 940 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 932 may communicate with mass data storage 946 that stores data in a nonvolatile manner. The mass data storage 946 may include optical and/or magnetic storage devices (for example, hard disk drives [HDDs] and/or DVDs). At least one HDD may have the configuration shown in FIG. 10A and/or at least one DVD may have the configuration shown in FIG. 10B. The HDD may be a mini HDD that includes one or more platters having a diameter that is smaller than approximately 1.8". The powertrain control system 932 may be connected to memory 947 such as RAM, ROM, low latency nonvolatile memory such as flash memory and/or other suitable electronic data storage. The powertrain control system 932 also may support connections with a WLAN via a WLAN network interface 948. The control system 940 may also include mass data storage, memory and/or a WLAN interface (all not shown).

Figure 10E:
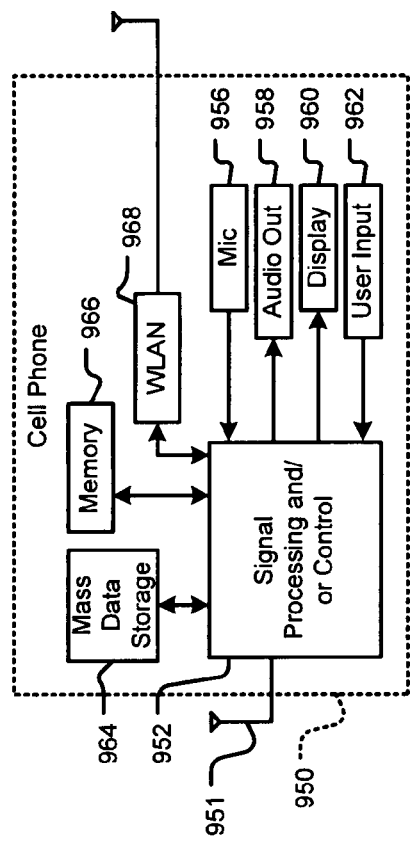

Referring now to FIG. 10E, the present invention can be implemented in a cellular phone 950 that may include a cellular antenna 951. The present invention may implement either or both signal processing and/or control circuits, which are generally identified in FIG. 10E at 952, a WLAN interface and/or mass data storage of the cellular phone 950. In some implementations, the cellular phone 950 includes a microphone 956, an audio output 958 such as a speaker and/or audio output jack, a display 960 and/or an input device 962 such as a keypad, pointing device, voice actuation and/or other input device. The signal processing and/or control circuits 952 and/or other circuits (not shown) in the cellular phone 950 may process data, perform coding and/or encryption, perform calculations, format data and/or perform other cellular phone functions.

The cellular phone 950 may communicate with mass data storage 964 that stores data in a nonvolatile manner such as optical and/or magnetic storage devices (for example, hard disk drives [HDDs] and/or DVDs). At least one HDD may have the configuration shown in FIG. 10A and/or at least one DVD may have the configuration shown in FIG. 10B. The HDD may be a mini HDD that includes one or more platters having a diameter that is smaller than approximately 1.8". The cellular phone 950 may be connected to memory 966 such as RAM, ROM, low latency nonvolatile memory such as flash memory and/or other suitable electronic data storage. The cellular phone 950 also may support connections with a WLAN via a WLAN network interface 968.

Figure 10F:
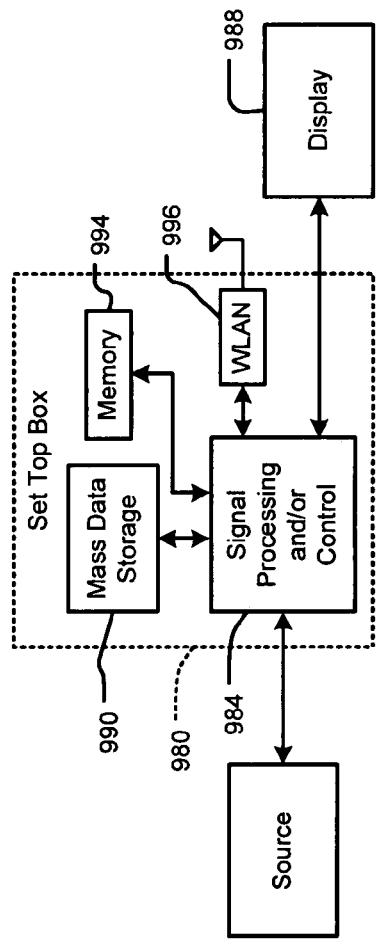

Referring now to FIG. 10F, the present invention can be implemented in a set top box 980. The present invention may implement either or both signal processing and/or control circuits, which are generally identified in FIG. 10F at 984, a WLAN interface and/or mass data storage of the set top box 980. The set top box 980 receives signals from a source such as a broadband source and outputs standard and/or high definition audio/video signals suitable for a display 988 such as a television and/or monitor and/or other video and/or audio output devices. The signal processing and/or control circuits 984 and/or other circuits (not shown) of the set top box 980 may process data, perform coding and/or encryption, perform calculations, format data and/or perform any other set top box function.

The set top box 980 may communicate with mass data storage 990 that stores data in a nonvolatile manner. The mass data storage 990 may include optical and/or magnetic storage devices (for example, hard disk drives [HDDs] and/or DVDs). At least one HDD may have the configuration shown in FIG. 10A and/or at least one DVD may have the configuration shown in FIG. 10B. The HDD may be a mini HDD that includes one or more platters having a diameter that is smaller than approximately 1.8". The set top box 980 may be connected to memory 994 such as RAM, ROM, low latency nonvolatile memory such as flash memory and/or other suitable electronic data storage. The set top box 980 also may support connections with a WLAN via a WLAN network interface 996.

Figure 10G:
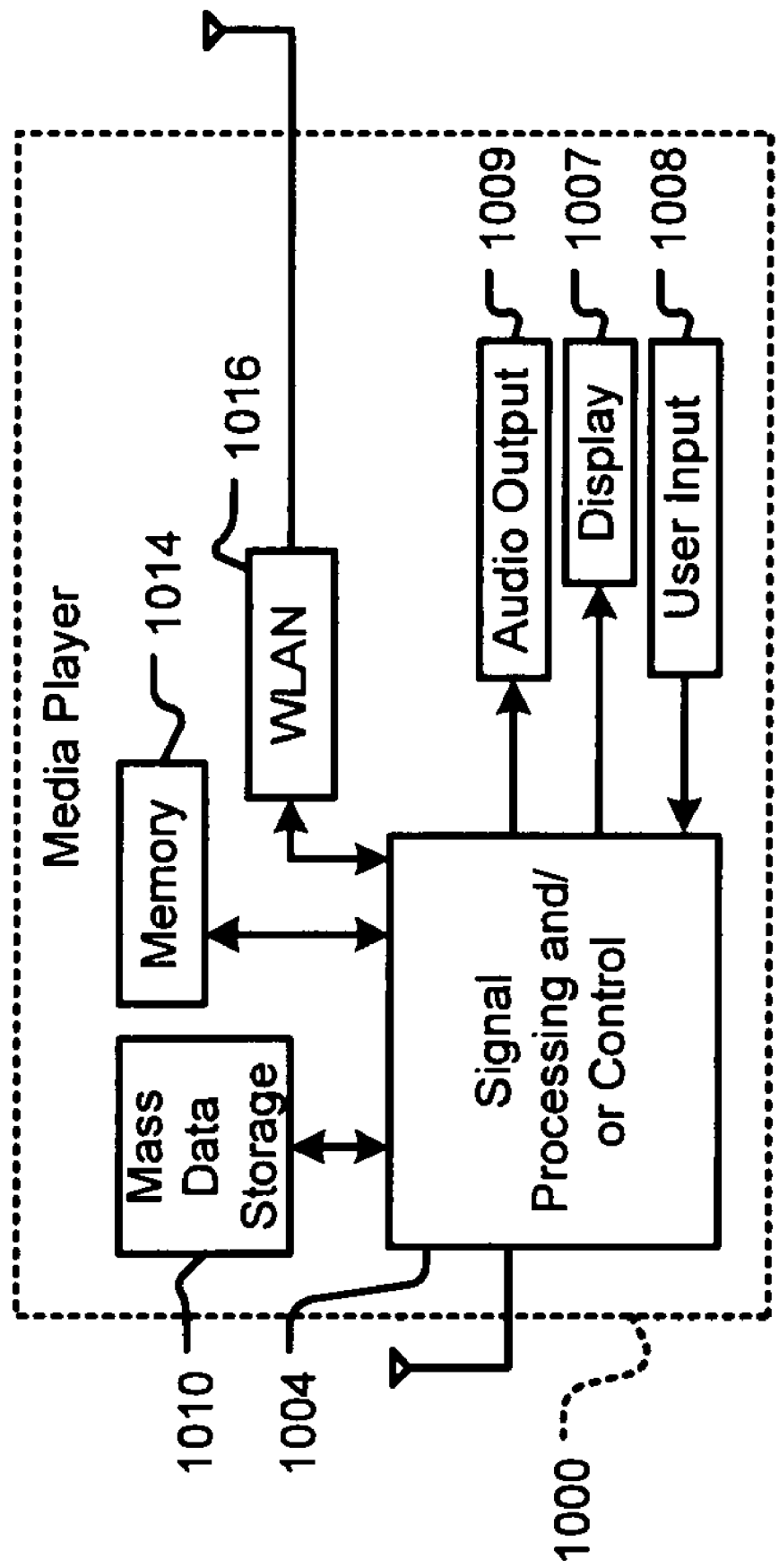

Referring now to FIG. 10G, the present invention can be implemented in a media player 1000. The present invention may implement either or both signal processing and/or control circuits, which are generally identified in FIG. 10G at 1004, a WLAN interface and/or mass data storage of the media player 1000. In some implementations, the media player 1000 includes a display 1007 and/or a user input 1008 such as a keypad, touchpad and the like. In some implementations, the media player 1000 may employ a graphical user interface (GUI) that typically employs menus, drop down menus, icons and/or a point-and-click interface via the display 1007 and/or user input 1008. The media player 1000 further includes an audio output 1009 such as a speaker and/or audio output jack. The signal processing and/or control circuits 1004 and/or other circuits (not shown) of the media player 1000 may process data, perform coding and/or encryption, perform calculations, format data and/or perform any other media player function.

The media player 1000 may communicate with mass data storage 1010 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices (for example, hard disk drives [HDDs] and/or DVDs). At least one HDD may have the configuration shown in FIG. 10A and/or at least one DVD may have the configuration shown in FIG. 10B. The HDD may be a mini HDD that includes one or more platters having a diameter that is smaller than approximately 1.8". The media player 1000 may be connected to memory 1014 such as RAM, ROM, low latency nonvolatile memory such as flash memory and/or other suitable electronic data storage. The media player 1000 also may support connections with a WLAN via a WLAN network interface 1016. Still other implementations in addition to those described above are contemplated.

CONCLUSION/SUMMARY

Thus, the present invention provides an apparatus and method for adjusting baseline offset of an analog signal in a read channel of an analog storage device. The apparatus comprises a current device between an AC-coupling circuit and a comparator, configured in response to an output of the comparator. The configurable current device may include one or more active current sources and/or sinks for injecting and/or removing charge from an output of an AC-coupling circuit, in parallel with the AC-coupling circuit. Such an apparatus provides for more precise and power efficient adjustments to the baseline of an analog signal.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An apparatus for compensating baseline offset in a read channel, the apparatus comprising:
    an AC-coupling circuit configured to transfer an analog signal from an analog storage device to said read channel;
    a configurable current device comprising a resistor and at least one active current source and at least one active current sink, wherein said configurable current device is coupled to said AC-coupling circuit;
    a comparator coupled to said AC-coupling circuit, wherein said comparator is configured to compare a voltage of said analog signal to a pre-determined voltage; and
    logic coupled to said configurable current device and said comparator, wherein said logic is adapted to determine said baseline offset and to configure said configurable current device in response to an output of said comparator by providing a signal to said at least one active current source and said at least one active current sink to apply a current to said resistor to compensate for said baseline offset.

2. The apparatus of claim 1, wherein said AC-coupling circuit comprises an input coupled to a first terminal of a capacitor; an output coupled to a second terminal of said capacitor and a first terminal of a resistor; and a common node coupled to a second terminal of said resistor.

3. The apparatus of claim 1, wherein said AC-coupling circuit provides a differential output.

4. The apparatus of claim 1, wherein said signal to said at least one active current source and said at least one active current sink maintains a constant current through said resistor.

5. The apparatus of claim 1, wherein said signal to said at least one active current source and said at least one active current sink maintains a variable current through said resistor.

6. The apparatus of claim 5, wherein said logic provides a signal adapted to maintain a pulsed current in said configurable current device, wherein the pulsed current has a magnitude, frequency, and/or pulse width corresponding to said baseline offset.

7. The apparatus of claim 6, wherein said pulsed current has a pulse width less than a time constant of said AC-coupling circuit.

8. The apparatus of claim 1, wherein said configurable current device comprises at least one active current source and at least one active current sink coupled to a node between said AC-coupling circuit and said comparator.

9. The apparatus of claim 1, further comprising an amplifier coupled to an output of said AC-coupling circuit.

10. The apparatus of claim 9, wherein said configurable current device is configured to limit a current in said amplifier.

11. The apparatus of claim 1, wherein said comparator comprises a configurable voltage comparator.

12. The apparatus of claim 1, wherein said comparator comprises a converter.

13. The apparatus of claim 12, wherein said converter comprises an analog-to-digital converter.

14. The apparatus of claim 1, further comprising a digital-to-analog converter coupled to said configurable current device and said logic.

15. The apparatus of claim 1, wherein said configurable current device comprises a buffer coupled to an output of said AC-coupling circuit.

16. An apparatus for compensating baseline offset in a read channel, the apparatus comprising:

an AC-coupling circuit configured to transfer an analog signal from an analog storage device to said read channel;

a configurable current device coupled to said AC-coupling circuit, wherein said configurable current device comprises a buffer coupled to an output of said AC-coupling circuit; a resistor coupled at a first terminal to an output of said buffer and at a second terminal to an input of said comparator; and at least one active current source and at least one active current sink coupled to said first terminal and/or said second terminal of said resistor;

a comparator coupled to said AC-coupling circuit, wherein said comparator is configured to compare a voltage of said analog signal to a pre-determined voltage; and logic coupled to said configurable current device and said comparator, wherein said logic comprises a look-up table adapted to output a current device setting signal to said configurable current device in response to an output of at least one of said AC-coupling circuit and said comparator corresponding to said baseline offset.

17. The apparatus of claim 9, wherein said configurable current device is coupled to an output of said amplifier.

18. A method of compensating baseline offset in a read channel, the method comprising:

coupling an analog storage device and said read channel with an AC-coupling circuit;

detecting a baseline or a component of an analog signal at a node downstream from said AC-coupling circuit;

determining an offset of said baseline or said component of said analog signal; and configuring a current device to modify said analog signal in response to said offset of said baseline or said component of said analog signal, wherein said current device is coupled to a node downstream from said AC-coupling circuit and upstream from a signal processor configured to operate on said analog signal, said current device comprises a resistor at least one active current source and at least one active current sink, and wherein configuring said current device comprises applying a variable current through said resistor by controlling said at least one active current source and at said at least one active current sink in response to said offset of said baseline or said component of said analog signal.

19. The method of claim 18, wherein said coupling comprises receiving a first signal from said analog storage device at a first terminal of a capacitor in said AC-coupling circuit; and transmitting a second signal to said read channel at a second terminal of said capacitor in said AC-coupling circuit.

20. The method of claim 18, further comprising comparing said analog signal or a component of said analog signal to one or more reference voltages.

21. The method of claim 18, wherein detecting said baseline or said component of said analog signal comprises filtering said analog signal or said component of said analog signal.

22. The method of claim 18, wherein detecting said baseline or said component of said analog signal comprises converting said analog signal or said component of said analog signal into a digital signal.

23. The method of claim 22, further comprising comparing said digital signal or component of said analog signal to one or more reference values.

24. The method of claim 18, wherein configuring said current device to modify said analog signal comprises sinking and/or sourcing current at a node between said AC-coupling circuit and said signal processor.

25. The method of claim 18, wherein configuring said current device to modify said analog signal comprises limiting a current through an amplifier coupled to said AC-coupling circuit and said signal processor.

26. The method of claim 18, wherein configuring said current device to modify said analog signal comprises sinking and/or sourcing current through said resistor said resistor being coupled to said AC-coupling circuit and said signal processor.

27. A method of compensating baseline offset in a read channel, the method comprising:

coupling an analog storage device and said read channel with an AC-coupling circuit;

detecting a baseline or a component of an analog signal at a node downstream from said AC-coupling circuit;

determining an offset of said baseline or said component of said analog signal; and outputting a current device setting signal from a look-up-table to at least one active current source and/or said at least one active current sink in a current device to modify said analog signal in response to said offset of said baseline or said component of said analog signal, wherein said current device is coupled to a node downstream from said AC-coupling circuit and upstream from a signal processor configured to operate on said analog signal, said current device comprises a resistor, at least one active current source and at least one active current sink, and said current device modifies said analog signal by sinking and/or sourcing current through said resistor coupled to said AC-coupling circuit and said signal processor.

28. A method of compensating baseline offset in a read channel, the method comprising:

reading data from an analog storage device to generate an analog signal for transmission in said read channel;

comparing said analog signal to a reference or converting said analog signal to a digital signal;

determining said baseline offset after comparing said analog signal or converting said analog signal to said digital signal; and configuring a current to be sourced to and/or sunk from a resistor by at least one active current source and at least one active current sink to compensate for said baseline offset in response to said digital signal or an outcome of said comparing step.

29. The method of claim 28, wherein comparing said analog signal to a reference or converting said analog signal to a digital signal comprises comparing said analog signal to one or more reference voltages.

30. The method of claim 28, further comprising filtering said analog signal.

31. The method of claim 28, wherein comparing said analog signal to a reference or converting said analog signal to a digital signal comprises converting said analog signal to said digital signal.

* * * * *